April 15, 1969 P. F. SCHMIDT 3,438,873

ANODIC TREATMENT TO ALTER SOLUBILITY OF DIELECTRIC FILMS

Filed May 11, 1966

INVENTOR
P. F. SCHMIDT
BY H W Lockhart
ATTORNEY

United States Patent Office 3,438,873

Patented Apr. 15, 1969

3,438,873

ANODIC TREATMENT TO ALTER SOLUBILITY OF DIELECTRIC FILMS

Paul F. Schmidt, Allentown, Pa., assignor to Bell Telephone Laboratories, Incorporated, Murray Hill, N.J., a corporation of New York Filed May 11, 1966, Ser. No. 549,338
Int. Cl. C23b 5/50
U.S. Cl. 204—35 8 Claims

ABSTRACT OF THE DISCLOSURE

A method of altering the solubility of a silicon nitride film by localized anodic treatment comprising forming a patterned dielectric film on a semiconductor surface, forming a continuous layer of silicon nitride over the dielectric film and semiconductor surface, anodically passing a current through the dual coated semiconductor which alters the solubility of that portion of the silicon nitride layer in contact with the semiconductor surface but not altering the solubility of that in contact with the dielectric film, and etching the composite to remove the portion of the layer with altered solubility.

This invention relates to the fabrication of semiconductor devices and particularly to the shaping of dielectric coatings formed on surfaces of semiconductor bodies during such fabrication.

Semiconductor devices, particularly those of the planar type including integrated circuits, use shaped films or patterns of film produced on the surfaces of semiconductor bodies to mask both diffusion and deposition processes. These films are used also for protection, and improved films both for this purpose and for masking are continually sought. Films of silicon oxide have been used for these processes but recently interest has developed in other inorganic compounds such as silicon nitride, aluminum oxide, and mixed silicates, for example, aluminum silicate.

A considerable art has developed around silicon oxide because of its compatibility with the well-known photoresist process, and in particular the resistance of the organic photoresist to hydrofluoric acid, the common etchant for silicon oxide. However, the above-mentioned materials of more current interest are not so compatible as silicon oxide, requiring in some instances, etchants which attack the organic photoresist. For example, phosphoric acid, a common etchant for silicon nitride, attacks photoresist materials thus rendering them useless as masks.

In accordance with this invention the shaping, by selective removal, of inorganic coatings or semiconductor bodies, is facilitated by anodization treatments of the coated bodies so as to alter the susceptibility of a coating or portion thereof to attack by etchants.

Accordingly, a broad object of this invention is to facilitate the fabrication of semiconductor devices.

A more specific object is to alter the etchability of certain inorganic films by an anodization treatment.

In accordance with one broad aspect of the invention a semiconductor body having an inorganic dielectric coating such as silicon nitride on a surface thereof, is immersed in a suitable electrolyte. An electric field is applied across the body and the coating thereon, with the electrolyte made cathodic and the body or substrate anodic. In accordance with one specific method the voltage is allowed to rise to a predetermined value while passing a constant current. During this procedure ionic current passes through the coating, that is, it is anodized. Following this treatment the coated body is immersed in an etchant such as buffered hydrofluoric acid which rapidly removes the silicon nitride to a depth substantially dependent on the length and intensity of the anodization treatment. The effectiveness of this treatment is manifest from the fact that in the absence of such anodization silicon nitride is virtually impervious to attack by hydrofluoric acid.

Moreover, the anodization treatment may be applied selectively by the intervention of another dielectric film selectively formed over or under the silicon nitride. A mask of silicon oxide, for example, will inhibit anodization and only the unmasked portions of the silicon nitride will be rendered susceptible to the subsequent etching treatment. This effect is due to the reduction in field strength caused by the interposition of the second dielectric mask.

The invention with its other objects and features will be more clearly understood from the following detailed description taken in conjunction with the drawing in which.

Figure 1:
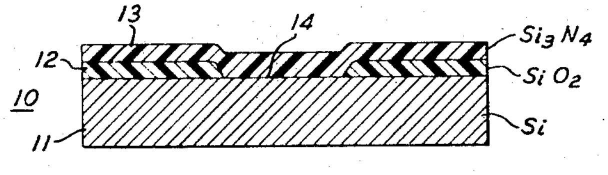
FIG. 1 is a cross section of a semiconductor body having several inorganic coatings thereon.

Referring to FIG. 1 there is illustrated a silicon semiconductor body 10 having a plurality of inorganic coatings on one surface thereof. The process in accordance with this invention will be described in terms of a single wafer 11 of silicon which constitutes only a small portion of a large slice of silicon semiconductor material, and it will be understood that the procedures described would be accomplished on an entire slice. In connection with the silicon wafer 11 of FIG. 1 the purpose of the processing is to provide the wafer with a suitable mask which in this case includes a layer of silicon nitride over the upper major surface of the wafer except for the portion 14 of the surface defined by the partial coating 12 of silicon oxide. In accordance with one specific technique a coating of silicon oxide is formed over the entire upper major surface by either thermal growth or by deposition techniques, both now well known in the art. Next a photoresist mask is formed on the surface of the silicon oxide coating 12 so as to expose the portion of the oxide coextensive with the surface portion 14. The masked surface then is treated with a hydrofluoric acid etch which removes the exposed oxide and reveals the surface portion 14. A coating of silicon nitride 13 then is formed on the entire oxide masked surface so as to overlay both the oxide coating 12 and the surface portion 14.

Figure 2:
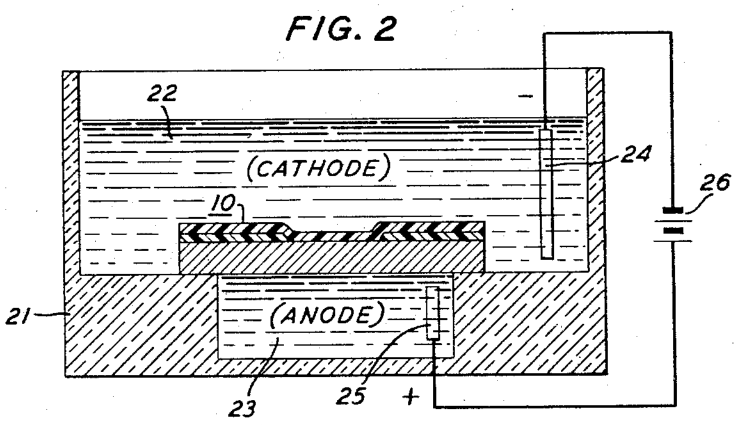
FIG. 2 shows an arrangement for accomplishing the anodization treatment in accordance with this invention on the semiconductor body of FIG. 1.

The body 10 then is immersed in the anodizing apparatus of FIG. 2. This comprises a suitable container 21 of a material resistant to the electrolytes employed. The container is arranged with a well portion of reduced cross-sectional area which may be isolated from the main portion of the container by the semiconductor body 10 itself. This is one convenient arrangement for contacting opposite faces of the body 10 with electrolyte baths of opposite polarities. Both the cathodic electrolyte 22 and the anodic electrolyte 23 are comprised of a solution of pyrophosphoric acid in tetrahydrofurfuryl alcohol. Another satisfactory electrolyte is a solution of potassium nitrite in tetrahydrofurfuryl alcohol. Immersed in both portions of the bath are platinum electrodes 24 and 25 connected to a source of direct current 26.

In a specific example the silicon oxide coating 12 was about 3000 Angstroms thick and the silicon nitride coating 13 was about 860 Angstroms thick. The electrolyte was a solution of 7.5 volume percent of pyrophosphoric acid in tetrahydrofurfuryl alcohol. A field was produced across the body 10 by passing a substantially constant current of five milliamperes per square centimeter of area which was maintained until the voltage rose to a level of 380 volts. During this period the silicon body 10 was converted to oxide in the surface area 14 underlying the silicon nitride which was not contiguous with the silicon oxide mask 12.

Figure 3:
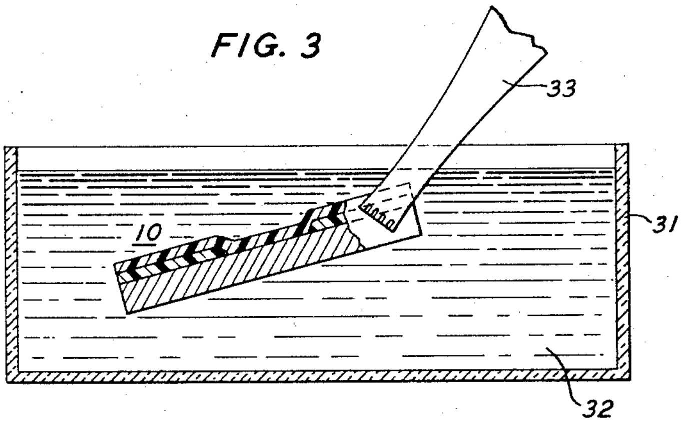
FIG. 3 illustrates the body immersed in an etching solution subsequent to anodization.
Figure 4:
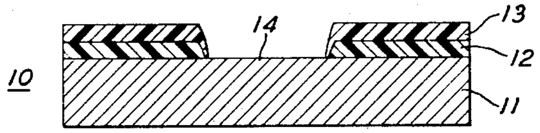
FIG. 4 shows the body upon completion of the process for forming a mask in accordance with this invention.

The semiconductor body 10 when then was removed from the anodization bath and, as indicated in FIG. 3 in schematic form, immersed using tweezers 33 in an etching solution 32 in a suitable container 31. In particular the etching solution was buffered hydrofluoric acid which in a period of about 10 seconds dissolved all of the portion of the silicon nitride coating 13 which was not contiguous to the silicon oxide mask 12. Referring to FIG. 4 the product is shown with coextensive masks of silicon oxide 12 and silicon nitride 13 defining the unmasked surface portion 14 of the silicon wafer 11.

The foregoing described procedure thus renders the silicon nitride coating susceptible to selective shaping for masking purposes using hydrofluoric acid, an etchant which is compatible with the other materials involved. Moreover, the rate of attack by the etchant is many times greater for the anodized films than for the unanodized. Accordingly, the removal of the nitride, for example, occurs before any appreciable etching of the oxide occurs. The procedure for anodization is suitable in the form described for silicon material of moderate or low resistivity. However, if the wafer 11 is of high resistivity it is desirable to shine light into the cell and upon the semiconductor body during the anodization treatment in order to provide sufficient minority carriers in the silicon by optical injection so as to sustain the required current flow.

Also, as is known in the art, anodization may be accomplished by using a substantially constant voltage with a decreasing current. In this procedure, the electrolyte will heat up.

In another specific procedure a silicon nitride film 13 of about double the thickness of that described above was applied and the same procedure was followed. In this instance after anodization a film of 1750 Angstroms thickness was found to be partially soluble in buffered hydrofluoric acid and in 10 seconds the nitride film was reduced to a thickness of about 870 Angstroms at which point the etching substantially terminated. The body then was subjected to a further anodization to the 380 volt level and subsequently re-etched so as to remove all of the unmasked silicon nitride.

Although the foregoing specific description has been in terms of silicon nitride the technique has also been applied to other inorganic coatings such as aluminum oxide films and films of mixed aluminum oxide-silicon oxide of the silicate type. The technique is applicable also to silicon carbide films which can be converted to silicon oxide by anodization and thus rendered soluble in hydrofluoric acid.

Also, the above-described specific embodiments use the silicon oxide film mask below the silicon nitride coating. The reverse arrangement may also be used by applying the nitride or aluminum oxide coating on the semiconductor surface and forming the silicon oxide mask on top of the first coating. Moreover, materials other than silicon oxide may be used for masking purposes. In general, any dielectric film which is insoluble in the electrolyte used for the anodization process may be employed as a masking material. For example, organic photoresist material has been found to be usable as a mask for the anodization treatment.

In addition to altering the insolubility of inorganic dielectric films as described above, it should also be indicated that thermally grown silicon oxide may be rendered more soluble by this anodization treatment. In particular a thermal silicon oxide film is rendered more soluble by an anodization treatment in which the portion applied is in excess of one volt for every five Angstroms of oxide thickness. Accordingly if a thermal silicon oxide is used as a dielectric mask it must be of sufficient thickness to withstand the applied anodization voltage. In particular its thickness in Angstroms must exceed five times the applied maximum voltage in volts.

Another general consideration in the process in accordance with this invention relates to the selection of the electrolyte employed which is significant to the alteration in solubility of the dielectric film. It appears that the electrolyte solution advantageously should contain only solvent molecules and electrolytic anions of large size. In an experiment involving a crystalline aluminum oxide film anodized in a solution of ammonium pentaborate in water the film was anodized but remained insoluble in hydrofluoric acid. The anodization was repeated in the solution of pyrophosphoric acid in tetrahydrofurfuryl alcohol which rendered the film soluble in hydrofluoric acid. It is postulated that in the first case the small oxygen or hydroxyl ions penetrated through the aluminum oxide crystalline film along grain boundaries or along cleavage planes, so that new oxide formed exclusively at the silicon to aluminum oxide interface, leaving the properties of the aluminum oxide film unchanged. In the second case no small anions were available and film growth occurred apparently throughout the thickness of the existing aluminum oxide film, changing its chemical composition and thus rendering it soluble.

Although the invention has been described in terms of certain specific embodiments, it will be understood that other arrangements may be devised by those skilled in the art which likewise will come within the scope and spirit of the invention.

What is claimed is:

1. In the fabrication of a semiconductor device the method of forming an inorganic dielectric film mask on a semiconductor body by altering the solubility of portions of the film, said method comprising forming on a surface of a semiconductor body a first and a second dielectric film, the first film being formed in accordance with a mask pattern, the second film being coextensive with said entire surface, subjecting said films to an anodization treatment thereby altering the solubility of those portions of the second film not contiguous with said first masking film and treating said body in an etching solution which attacks only the portions of said second film having altered solubility.

2. The method in accordance with claim 1 in which said anodization treatment comprises immersing the body in an electrolyte, applying an electric field across said body and through said films for a period of time sufficient to produce enhanced solubility of portions of said second film.

3. The method in accordance with claim 1 in which said first film is of silicon oxide and said second film is selected from the group consisting of silicon nitride, aluminum oxide, and aluminum silicates.

4. In the fabrication of a semiconductor device the method of forming an inorganic dielectric film mask on a semiconductor body by altering the solubility of portions of the film, said method comprising forming on a surface of a semiconductor body a first dielectric film in accordance with a mask pattern and a continuous second inorganic dielectric film coextensive with said surface, immersing the body in an electrolytic solution, applying an electric field across said body and through said films for a period of time sufficient to alter the solubility only of the unmasked portions of the second film, removing the body from the electrolyte and treating the body with a solution which attacks only the portions of the second film not masked by the first film.

5. The method in accordance with claim 4 in which the mask is in contact with the surface of the semiconductor body and the second film is on top of the mask.

6. The method in accordance with claim 4 in which the second film is in contact with the surface of the semiconductor body and the mask is on top of the second film.

7. The method in accordance with claim 4 in which the electric field is applied at a constant current with the voltage rising to a predetermined level.

8. The method in accordance with claim 4 in which the electric field is applied at constant voltage, and the current is permitted to decay until essentially all of the applied voltage appears across the dielectric film.

References Cited

UNITED STATES PATENTS

| | | | |
|---|---|---|---|
| 2,974,075 | 3/1961 | Miller | 148—6.3 |
| 3,088,888 | 5/1963 | Left | 204—143 |
| 3,160,539 | 12/1964 | Hall et al. | 156—17 |

HOWARD S. WILLIAMS, *Primary Examiner.*

W. B. VAN SISE, *Assistant Examiner.*

U.S. Cl. X.R.

156—17, 7, 93; 29—578, 584; 117—200; 204—15, 38, 143, 56; 317—238